United States Patent [19]

Glasby et al.

[11] Patent Number: 4,739,194
[45] Date of Patent: Apr. 19, 1988

[54] SUPERGATE FOR HIGH SPEED TRANSMISSION OF SIGNALS

[75] Inventors: Dennis E. Glasby; Ira G. Pollock, both of Beaverton; Gale F. Hall, Hillsboro, all of Oreg.

[73] Assignee: Tektronix, Inc., Beaverton, Oreg.

[21] Appl. No.: 934,896

[22] Filed: Nov. 25, 1986

[51] Int. Cl.⁴ ............................... H03K 19/013
[52] U.S. Cl. ..................... 307/455; 307/443; 307/475; 307/494; 330/261
[58] Field of Search ............... 307/200 A, 443, 446, 307/454–455, 475, 494, 495, 254, 270; 330/254, 258, 261

[56] References Cited

U.S. PATENT DOCUMENTS

| | | | |
|---|---|---|---|
| 3,982,115 | 9/1976 | Traa | 307/494 X |
| 4,393,347 | 7/1983 | Looper | 330/258 X |
| 4,437,021 | 3/1984 | Sumi et al. | 307/494 X |
| 4,513,283 | 4/1985 | Leininger | 307/455 X |
| 4,518,876 | 5/1985 | Constantinescu | 307/475 |
| 4,536,665 | 8/1985 | Dayton | 307/443 X |
| 4,593,211 | 6/1986 | Belforte | 307/443 X |
| 4,605,864 | 8/1986 | Varadarajan et al. | 307/443 X |
| 4,616,190 | 10/1986 | van de Plassche | 330/261 |
| 4,620,115 | 10/1986 | Lee et al. | 307/443 |

OTHER PUBLICATIONS

Williams, "Emitter Coupled Logic to Either Long Line or Send Receive Mode Bidirectional Convert Circuit", IBM T.D.B., vol. 18, No. 12, 5-1976, pp. 4101-4103.
Weiss, "Current Switch Circuit", IBM T.D.B., vol. 12, No. 9, Feb. 1970, pp. 1423-1424.

Primary Examiner—Stanley D. Miller
Assistant Examiner—D. R. Hudspeth
Attorney, Agent, or Firm—Francis I. Gray; Boulden G. Griffth

[57] ABSTRACT

A supergate having an enabled differential input, a single ended input and a differential output provides high speed communication between electronic cards in an electronic device. The enabled differential input is input to a differential amplifier which is electrically driven by a current source. A differential AND gate having the single ended input as an input is electrically driven by one output of the differential amplifier and provides the differential output. The other output of the differential amplifier is OR'd with one side of the differential output so that the propagation delay for the enabled differential input is essentially the same as that for the single ended input. Current steering is used to provide high speed signal flow through the differential amplifier and the differential AND gate.

4 Claims, 2 Drawing Sheets

SUPERGATE FOR HIGH SPEED TRANSMISSION OF SIGNALS

BACKGROUND OF THE INVENTION

The present invention relates to integrated circuit gates, and more particularly to an ECL supergate circuit to provide high speed communication between circuit boards in a semi-compatible environment.

Electronic devices, such as test instruments, contain a plurality of printed circuit or integrated circuit cards, each having a complex electronic circuit. Signals from these cards have to be communicated to other cards to be combined with other signals or for other signal processing. Usually these cards are connected together by a backplane, which is a circuit board having a plurality of interconnected connectors to which the cards are connected. Each card has its own power supply source which may vary from card to card. A typical circuit for communicating from one card to another across the backplane would provide for a differential input, a single ended input and a differential output. Current integrated circuits require the combination of two different integrated circuits, such as the 100114 Quintuple Differential Line Receiver followed by the 100102 Quintuple Two-Input OR/NOR Gate with Common Enable Differential In—Differential Out manufactured by Signetics Corporation of Sunnyvale, Calif. The typical delay for a signal through these gates is approximately 0.65–2.2 nsec plus 1.0–1.95 nsec for a total delay of 1.65–4.15 nsec with a difference in the amount of delay between the differential input and single ended input at the differential output. For communication rates of 250 MHz and above this propagation delay through the gates is unacceptable.

What is desired is a supergate which provides communication between semi-compatible cards with a propagation delay compatible with high speed communications.

SUMMARY OF THE INVENTION

Accordingly the present invention provides a supergate in the form of an ECL OR/AND gate with single ended input Y, enabled differential input (X+E) and differential output O for communication between circuit cards across the backplane of an electronic device. A differential input is applied to a differential amplifier with an enable input OR'd with one side of the differential input. The output of the enable side of the differential amplifier is AND'd with a single ended input at a second differential amplifier, the single ended input being input at one side. The second output side of the first differential amplifier is connected to one differential output. The outputs of the second differential amplifier are connected to the respective differential outputs. A current source provides the energy for the circuit, the current being steered according to the function $O=(X+E)*Y$.

The objects, advantages and novel features of the present invention will be apparent from the following detailed description when read in conjunction with the appended claims and attached drawing.

DESCRIPTION OF THE PREFERRED EMBODIMENT

Figure 1:
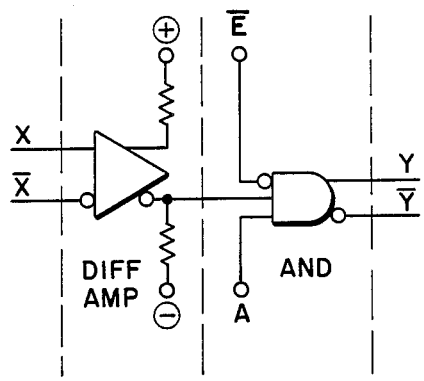
FIG. 1 is a block diagram of a prior art combination for providing a communication interface between electronic cards.
Figure 2:
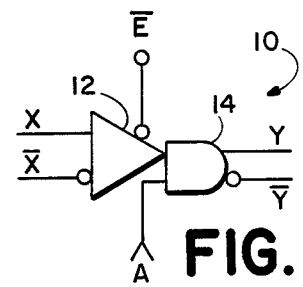
FIG. 2 is a block diagram of a supergate according to the present invention.
Figure 3:
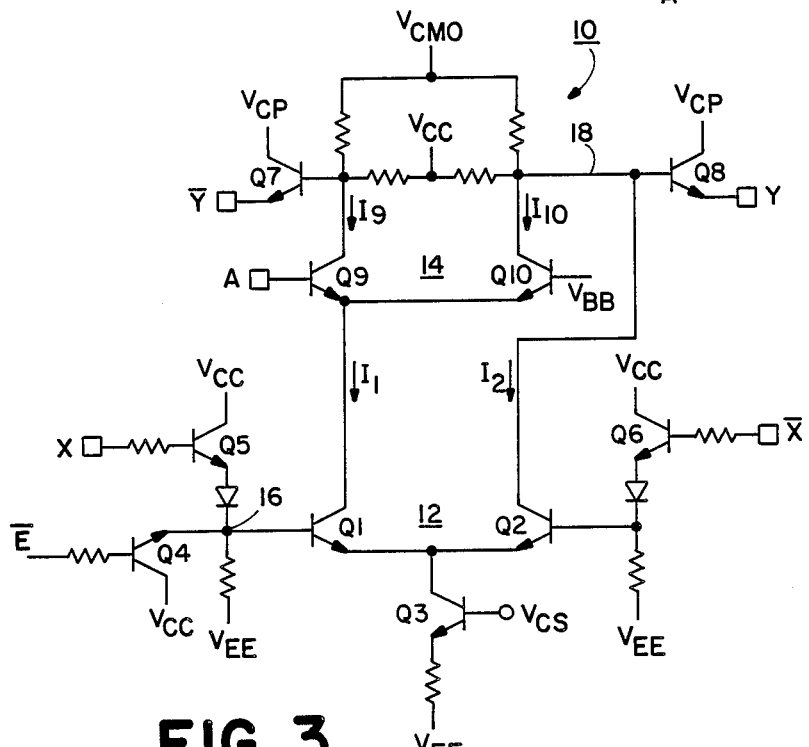
FIG. 3 is a schematic diagram of the supergate of FIG. 2.

Referring now to FIGS. 2 and 3 a differential input X, /X is input to a differential amplifier 12 which also has an enable input /E. A single ended input A is input to a differential AND gate 14 where it is combined with the differential input X, /X or just differentially amplified according to the enable /E to produce a differential output Y, /Y. Merely combining the prior art IC circuits as shown in FIG. 1, which eliminates the external line connection between circuits which is one source of delay, is not sufficient to produce the desired results since a signal would still pass through the same number of stages. A different configuration is needed.

The differential amplifier 12 is made up of transistor pair Q1, Q2 having a current source Q3. The enable signal /E is input via transistor Q4 to a node 16 which acts as an OR gate. The differential input X, /X is input via respective buffer amplifiers Q5, Q6 to the differential amplifier 12 at Q1, Q2 respectively. The X differential input is combined with /E at the node 16 prior to input to Q1. The output of Q2 is connected directly to an output buffer amplifier Q8 to produce Y. The output of Q1 acts as a current source for the differential AND gate 14 having transistors Q9, Q10. The single ended signal A is input to one transistor Q9 with the other transistor Q10 having a fixed base bias. The outputs of the differential AND gate 14 are connected to the output buffer amplifiers Q7, Q8 respectively to produce the differential output /Y, Y, with the output of Q2 and the output of Q10 being OR'd together at node 18.

In operation the current from Q3 is steered between Q1 and Q2. When the enable signal is present, /E is low and the conduction of Q1 is determined by the differential input X and the conduction of Q2 is determined by the differential input /X. Only one of the transistors Q1, Q2 conducts at a time. If the enable signal is absent, /E is high and holds Q1 on constantly, regardless of the differential input X, /X. Transistor Q1 then acts as a current source for the differential AND gate 14 such that the single ended input A at Q9 produces a differential output Y, /Y at Q8, Q7 respectively. If the differential input /X, /X is enabled, i.e., /E is low, then the differential input X, /X is AND'd with the single ended input A to produce the differential output Y, /Y. That is if A is high and X is high, current is steered through transistors Q1 and Q9, transistors Q2 and Q10 are off, and the output Y is high. If A is low and X is high, current is steered through transistors Q1 and Q10, transistors Q2 and Q9 are off, and the output Y is low. If X is low, regardless of the value of A, current is steered through transistor Q2, transistors Q1, Q9 and Q10 are off, and the output Y is low. As is apparent the signal path for the differential input X, /X and the single ended input A are essentially identical so there is no significant propagation difference between the two inputs at the differential output. Also the use of current steering is an inherently fast configuration, resulting in a total propagation delay on the order of 0.45–0.75 nsec with a rise time of 1.0 nsec, thereby providing stable replication of signals across module interfaces at 250 MHz and above. Table I below illustrates the logical function of the supergate 10.

TABLE I

| E | X | A | Y |
|---|---|---|---|
| 1 | 0 | 0 | 0 |
| 1 | 0 | 1 | 1 |
| 1 | 1 | 0 | 0 |
| 1 | 1 | 1 | 1 |
| 0 | 0 | 0 | 0 |
| 0 | 0 | 1 | 0 |
| 0 | 1 | 0 | 0 |
| 0 | 1 | 1 | 1 |

This corresponds to the function $Y = (X + E)*A$.

This corresponds to the function $Y=(X+E)*A$.

Figure 4:
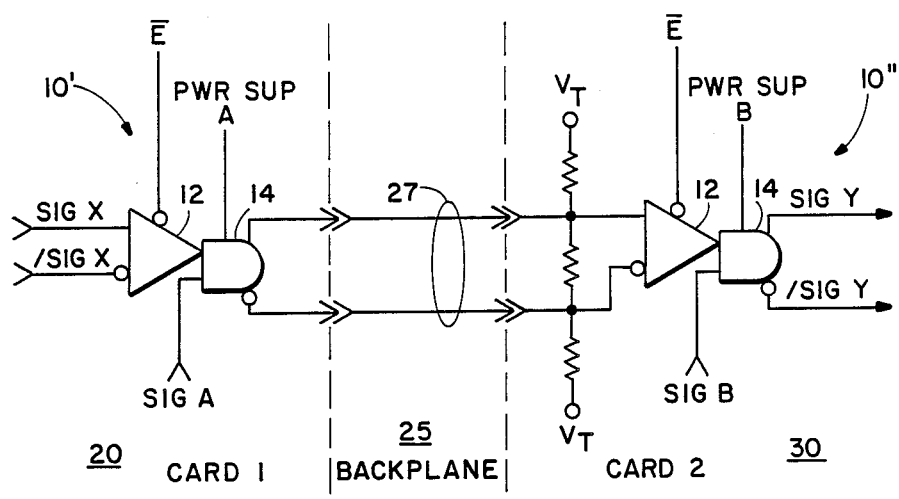
FIG. 4 is a block diagram of a communication interface between electronic cards using the supergate of the present invention.

A common application of the supergate 10 is illustrated in FIG. 4. A first card 20 has a first power supply A and a second card 30 has a second power supply B such that the two cards are only semi-compatible. Power supplies A and B may be derived from a common power supply, but may differ on the respective cards due to different loads or the like. To communicate across a backplane 25 via a backplane connector 27 a first supergate 10' has a differential input SIGX, /SIGX which is enabled by /E and a single ended input SIGA. The differential output of the first supergate 10' is input via the backplane connector 27 as a differential input to a second supergate 10" which is enabled by /E. Also input to the second supergate 10" is a single ended input SIGB which is AND'd with the enabled differential input to produce the resulting differential output SIGY, /SIGY. A terminator voltage system having a series of resistors connected between the differential lines of the backplane connector 27 and a termination voltage $V_t$ provides an impedance match between the two cards 20, 30. The result is fast communication between electrical circuit cards which have reasonable specification variations with very tight propagation delays, good symmetry and reliable noise immunity.

Thus the present invention provides a supergate in the form of an OR/AND gate with single ended input, enabled differential input and differential output which uses current switching to minimize propagation delay, provides essentially equal signal paths for the input signals to minimize differences in propagation delay, and increases interfacing technology to 250 MHz and above.

What is claimed is:

1. A supergate comprising:

a differential amplifier to which is input a differential input signal with one side OR'd with an enable signal;

a differential AND gate to which is input a single ended input signal, the differential AND gate being electrically driven by one output of the differential amplifier to which the OR'd enable signal is input and having the other output of the differential amplifier OR'd with one output of the differential AND gate, the outputs of the differential AND gate providing a differential output; and means for electrically driving the differential amplifier to provide current steering so that the supergate performs the function $Y=(X+E)*A$ where Y is the differential output, X is the differential input signal, E is the inverse of the enable signal and A is the single ended input signal.

2. A supergate as recited in claim 1 wherein the driving means comprises a current source connected to the differential amplifier to provide current steering for the differential amplifier.

3. An electrical module interface comprising:

a first supergate having a differential amplifier to which is input an enabled differential input, a differential AND gate with a single ended input which is driven by the output of the differential amplifier producing a differential output, and means for electrically driving the differential amplifier using current steering technology so that the function $Y=(X+E)*A$ is performed, where Y is the differential output, X is the enabled differential input, E is the inverse of an enable signal to pass the enabled differential input to the differential AND gate, and A is the single ended input, the first supergate being at the output of a first electrical module;

a second supergate identical to the first supergate at the input of a second electrical module, the differential output of the first supergate being connected to the enabled differential input of the second supergate such that the electrical modules are electrically interfaced; and means for impedance matching the differential output of the first supergate to the enabled differential input of the second supergate to compensate for common mode differences between the electrical modules.

4. An electrical module interface as recited in claim 3 wherein the driving means of the supergates comprises a current source connected to the differential amplifier to provide current steering for the differential amplifier.

* * * * *